(12) United States Patent
Miura

(10) Patent No.: US 10,043,639 B2
(45) Date of Patent: Aug. 7, 2018

(54) SUBSTRATE PROCESSING APPARATUS AND SUBSTRATE PROCESSING METHOD

(71) Applicant: Tokyo Electron Limited, Tokyo (JP)

(72) Inventor: Shigehiro Miura, Iwate (JP)

(73) Assignee: Tokyo Electron Limited, Tokyo (JP)

( * ) Notice: Subject to any disclaimer, the term of this patent is extended or adjusted under 35 U.S.C. 154(b) by 0 days.

(21) Appl. No.: 15/789,059

(22) Filed: Oct. 20, 2017

(65) Prior Publication Data

US 2018/0047545 A1 Feb. 15, 2018

Related U.S. Application Data

(62) Division of application No. 15/051,801, filed on Feb. 24, 2016.

(30) Foreign Application Priority Data

Mar. 3, 2015 (JP) ................. 2015-041500

(51) Int. Cl.
*H01J 37/32* (2006.01)
*H01L 21/3065* (2006.01)
*H01L 21/687* (2006.01)
*H01L 21/311* (2006.01)
*H01L 21/02* (2006.01)

(52) U.S. Cl.
CPC .. *H01J 37/32449* (2013.01); *H01J 37/32009* (2013.01); *H01J 37/3244* (2013.01); *H01J 37/32513* (2013.01); *H01J 37/32715* (2013.01); *H01J 37/32724* (2013.01); *H01J 37/32899* (2013.01); *H01L 21/0228* (2013.01); *H01L 21/30655* (2013.01); *H01L 21/31116* (2013.01); *H01L 21/68764* (2013.01); *H01J 2237/20214* (2013.01); *H01J 2237/332* (2013.01); *H01J 2237/334* (2013.01)

(58) Field of Classification Search
None
See application file for complete search history.

(56) References Cited

U.S. PATENT DOCUMENTS

2008/0026162 A1    1/2008  Dickey et al.
2010/0190341 A1    7/2010  Park et al.
2012/0267341 A1*  10/2012  Kato ................. H01L 21/02164
                                                                  216/37

(Continued)

FOREIGN PATENT DOCUMENTS

JP    2003-142484    5/2003
JP    2010-056470    3/2010
JP    2012-209394   10/2012

*Primary Examiner* — Jiong-Ping Lu
(74) *Attorney, Agent, or Firm* — IPUSA, PLLC

(57) ABSTRACT

A substrate processing method includes an etching step of mounting a substrate on a surface of a rotatory table arranged in a vacuum chamber and supplying an etching gas into the vacuum chamber while rotating the rotary table to etch a film formed on a surface of the substrate. The etching step includes supplying the etching gas to the surface of the rotary table and supplying a purge gas from a plurality of purge gas supply units that are provided near a region where the etching gas is supplied, and controlling an etching amount of etching the film by independently varying a flow rate of the purge gas that is supplied from each of the plurality of purge gas supply units.

6 Claims, 10 Drawing Sheets

(56) References Cited

U.S. PATENT DOCUMENTS

2013/0180452 A1     7/2013   Kato et al.
2014/0370628 A1   12/2014   Sato
2015/0194298 A1     7/2015   Lei et al.

* cited by examiner

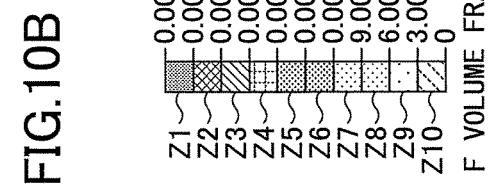
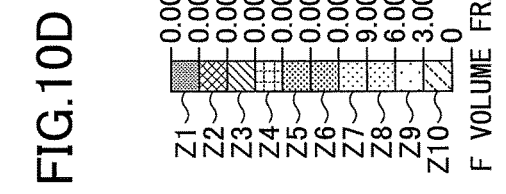
FIG.10A　　　　　　　　　　FIG.10B
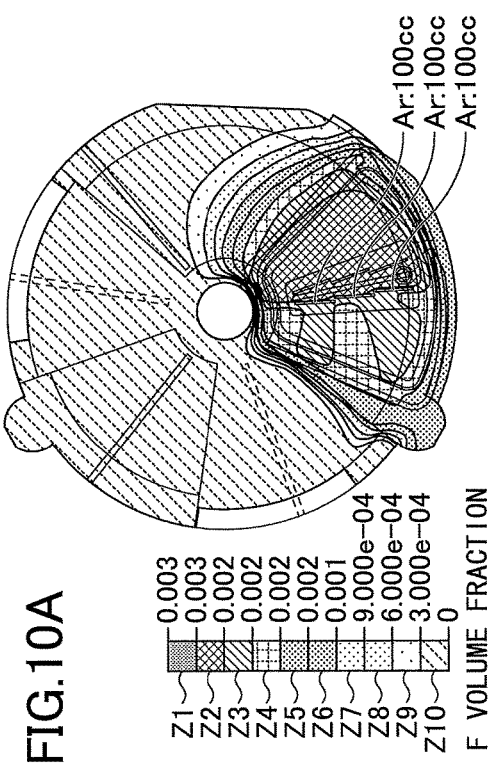
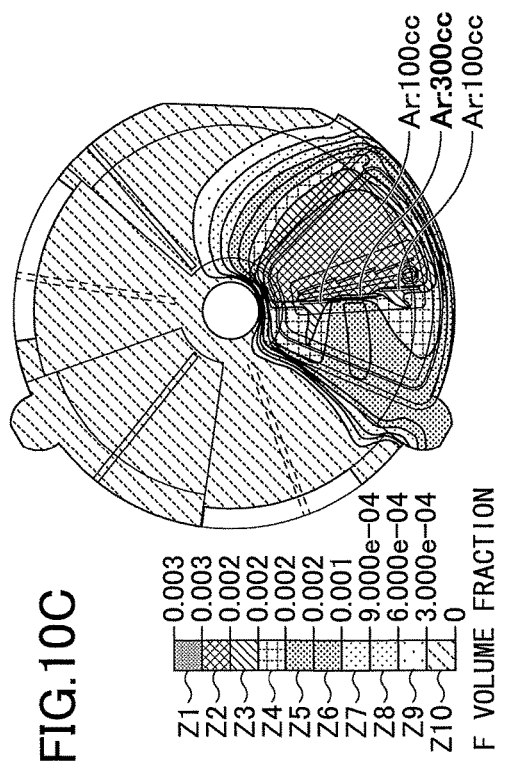
FIG.10C　　　　　　　　　　FIG.10D

SUBSTRATE PROCESSING APPARATUS AND SUBSTRATE PROCESSING METHOD

CROSS-REFERENCE TO RELATED APPLICATIONS

The present application is a divisional application and claims priority under 35 U.S.C. 120 to U.S. patent application Ser. No. 15/051,801 filed on Feb. 24, 2016, which claims priority under 35 U.S.C. 119 to Japanese Patent Application No. 2015-041500 filed on Mar. 3, 2015. The entire contents of the foregoing applications are incorporated herein by reference.

BACKGROUND OF THE INVENTION

1. Field of the Invention

The present invention generally relates to a substrate processing apparatus and a substrate processing method.

2. Description of the Related Art

With the miniaturization of circuit patterns of semiconductor devices, there is a growing demand for techniques for reducing the thickness and improving the uniformity of various films constituting semiconductor devices. In view of such a demand, the so-called molecular layer deposition (MLD) method or the atom layer deposition (ALD) method is known as a film forming method that involves supplying a first reaction gas to a substrate to cause adsorption of the first reaction gas to the surface of the substrate, then supplying a second reaction gas to the substrate to cause a reaction between the first reaction gas that is adsorbed on the surface of the substrate and the second reaction gas, and depositing a film that is made of the reaction product on the substrate (e.g., see Japanese Laid-Open Patent Publication No. 2010-56470).

According to the above film forming method, the reaction gas may be adsorbed to the surface of the substrate in a (quasi) self-saturating manner such that high film thickness controllability, desirable uniformity, and desirable embedding characteristics may be achieved.

However, in view of the miniaturization of circuit patterns, for example, as the aspect ratio of a space in a line/space pattern increases in a trench element separation structure, it becomes increasingly difficult to embed a film in a trench or a space even when the MLD method or the ALD method is used.

For example, when embedding a space having a width of about 30 nm in a silicon oxide film, it may be difficult to introduce a reaction gas to the bottom of such a narrow space, and as a result, the film thickness at the upper end portions of line side walls defining the space may increase. Thus, in some cases, a void may be created in the silicon oxide film having a space embedded by a film. When such a silicon oxide film is etched in a subsequent etching process, for example, an opening communicating with the void may be formed at the upper surface of the silicon oxide film. In such case, an etching gas (or etching solution) may enter the void through the opening to cause contamination, or a metal may enter the void during a metallization process performed thereafter to create defects, for example.

The occurrence of such a problem is not limited to the case of using the MLD method or the ALD method, but may also occur in the case of using a chemical vapor deposition (CVD) method. For example, when embedding a film made of conductive material in a contact hole that is formed in a semiconductor substrate to create a conductive contact hole (a so-called plug), a void may be formed in the plug. In this respect, a method of forming a conductive contact hole while preventing the formation of such a void in the conductive contact hole is known. For example, when embedding a conductive material in a contact hole to form a conductive contact hole, an etch back process may be repeatedly performed to remove any overhanging portion of the conductive material that is formed around the upper end of the contact hole (e.g., see Japanese Laid-Open Patent Publication No. 2003-142484).

However, according to the method described in Japanese Laid-Open Patent Publication No. 2003-142484, the process of forming the conductive material film and the etch back process have to be performed in different apparatuses. Thus, time is required in transporting the substrate back and forth between the apparatuses and stabilizing process conditions in each apparatus such that throughput cannot be increased.

Also, a film forming apparatus and a film forming method are known that may solve the above problems of the method described in Japanese Laid-Open Patent Publication No. 2003-142484. The film forming apparatus and the film forming method enable embedding at a high throughput while reducing the occurrence of voids in a concave pattern formed on the surface of a substrate. The film forming apparatus includes a rotary table on which a substrate is mounted, first and second gas supply units that are capable of supplying first and second reaction gases for film formation to a substrate mounting surface of the rotary table, and an activated gas supply unit that activates and supplies a modification gas for modifying a reaction product generated by a reaction between the first and second reaction gases and an etching gas used for etching. The film formation method involves using such a film forming apparatus to successively repeat the processes of film formation, modification, and etching within the same processing chamber through rotation of the rotary table (e.g., see Japanese Laid-Open Patent Publication No. 2012-209394).

However, in the film forming method described in Japanese Laid-Open Patent Publication No. 2012-209394, the etching amount distribution in the substrate surface cannot be adequately controlled, and it is difficult to achieve etching uniformity in the substrate surface.

SUMMARY OF THE INVENTION

One aspect of the present invention provides a substrate processing method that is capable of controlling an etching amount distribution within a substrate surface.

According to one embodiment of the present invention, a substrate processing method is provided that includes an etching step of mounting a substrate on a surface of a rotatory table arranged in a vacuum chamber and supplying an etching gas into the vacuum chamber while rotating the rotary table to etch a film formed on a surface of the substrate. The etching step includes supplying the etching gas to the surface of the rotary table and supplying a purge gas from a plurality of purge gas supply units that are provided near a region where the etching gas is supplied, and controlling an etching amount of etching the film by independently varying a flow rate of the purge gas that is supplied from each of the plurality of purge gas supply units.

BRIEF DESCRIPTION OF THE DRAWINGS

FIGS. 10A-10D are diagrams showing other simulation results of the fluorine volume fraction within the vacuum chamber during an etching process.

DESCRIPTION OF THE PREFERRED EMBODIMENTS

Figure 1:
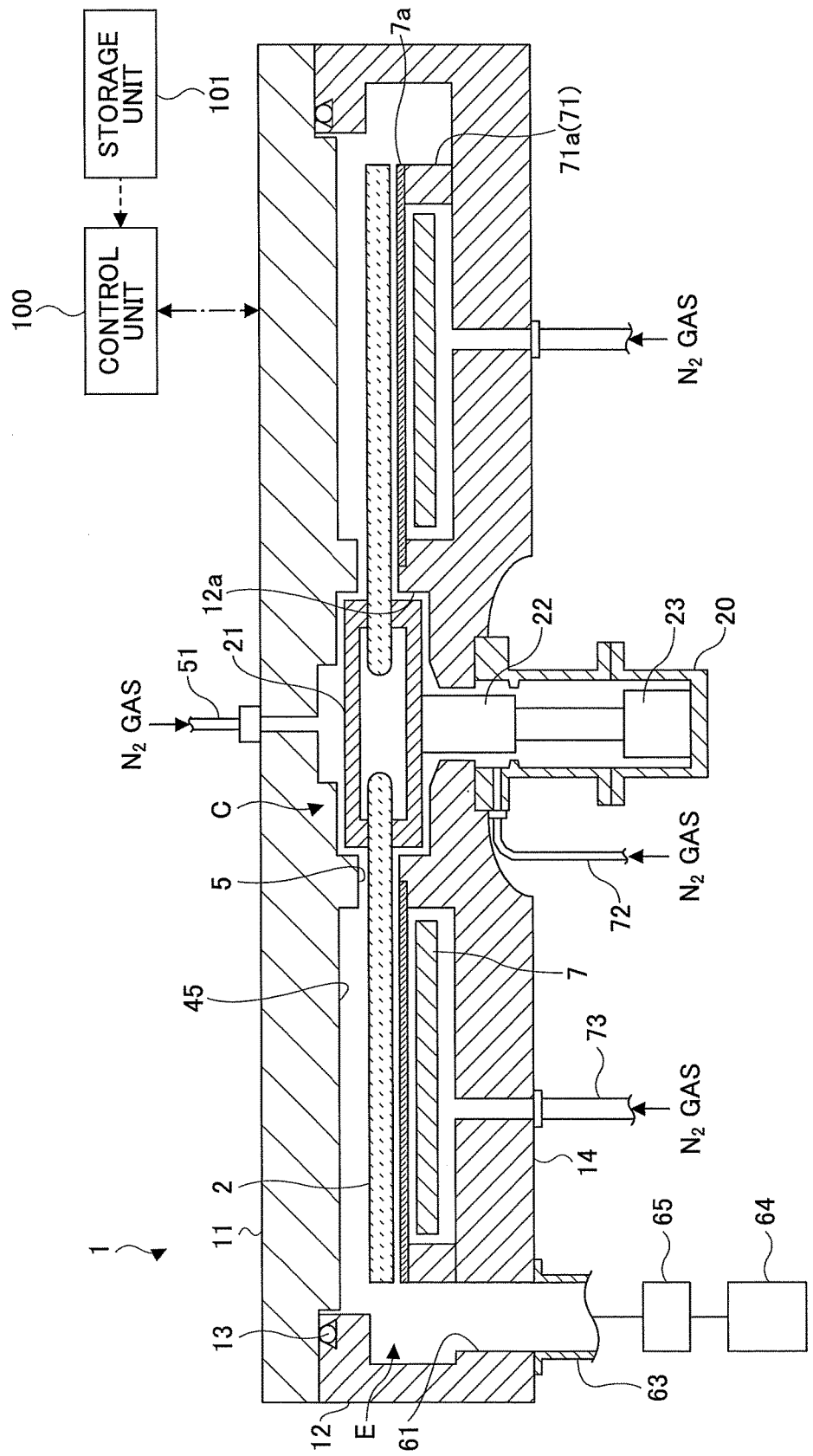
FIG. 1 is a schematic cross-sectional view of a substrate processing apparatus according to an embodiment of the present invention.

In the following, embodiments of the present invention will be described with reference to the accompanying drawings. Note that in the following descriptions and the accompanying drawings, elements having substantially the same functional features are given the same reference numerals and overlapping descriptions thereof may be omitted.

(Substrate Processing Apparatus Configuration)

Figure 2:
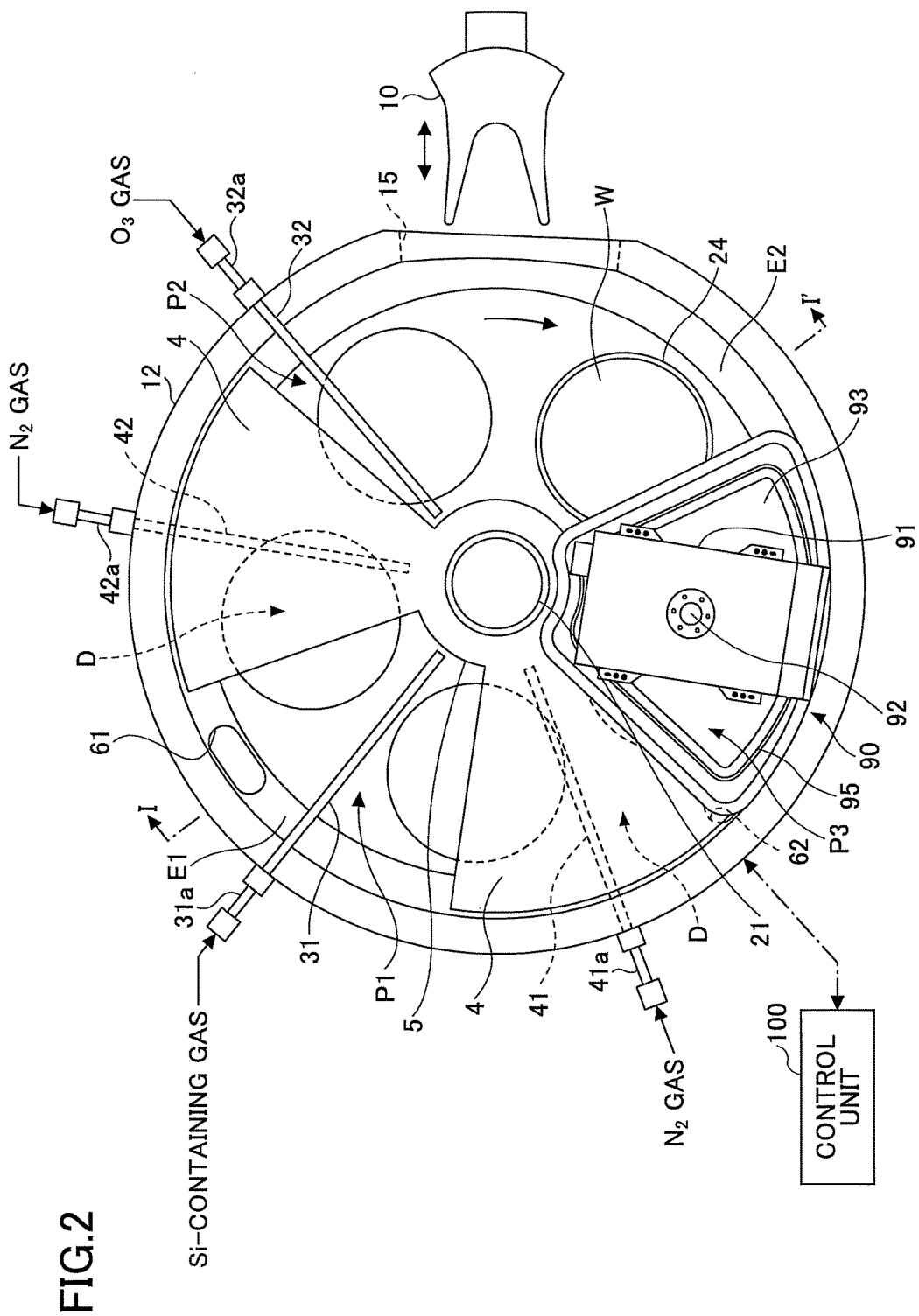
FIG. 2 is a schematic plan view of the substrate processing apparatus.
Figure 3:
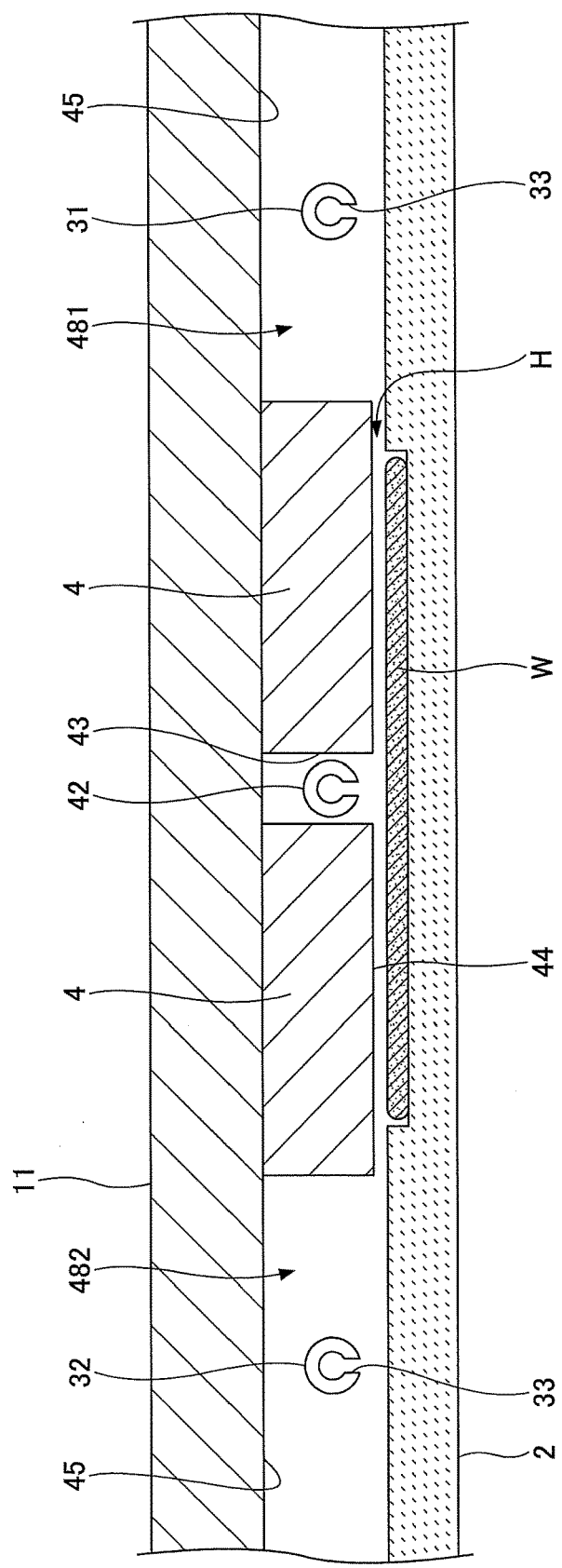
FIG. 3 is a partial cross-sectional view illustrating separation regions in the substrate processing apparatus.
Figure 4:
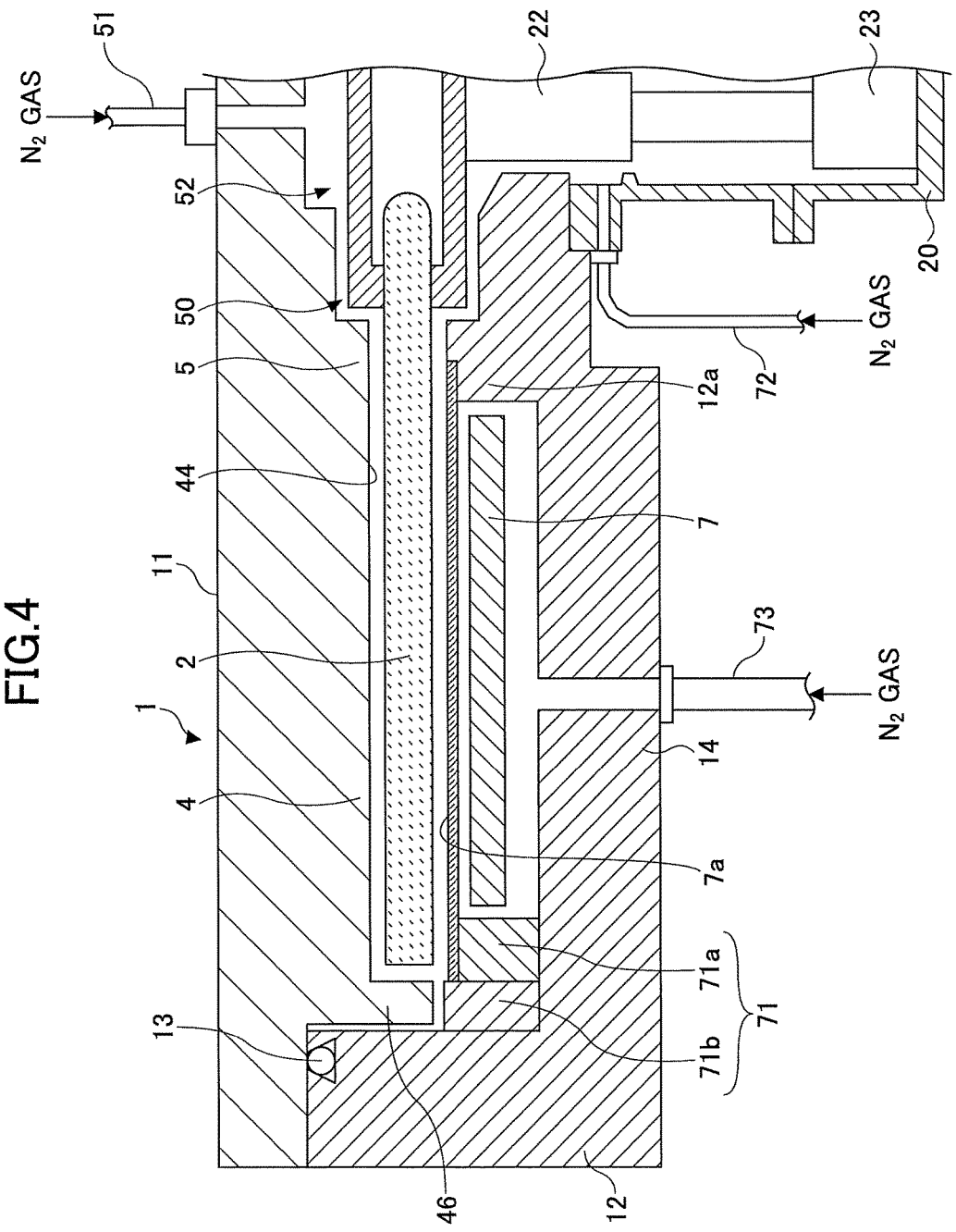
FIG. 4 is another partial cross-sectional view of the substrate processing apparatus.

In the following, the configuration of a substrate processing apparatus according to an embodiment of the present invention is described. FIG. 1 is a schematic cross-sectional view of the substrate processing apparatus according to the present embodiment. FIG. 2 is a schematic plan view of the substrate processing apparatus according to the present embodiment. FIG. 3 is a partial cross-sectional view illustrating separation regions of the substrate processing apparatus according to the present embodiment. FIG. 4 is another partial cross-sectional view of the substrate processing apparatus according to the present embodiment.

As illustrated in FIGS. 1 and 2, the substrate processing apparatus according to the present embodiment includes a vacuum chamber 1 having a substantially circular plane shape, and a rotary table 2 that is arranged within the vacuum chamber 1 such that the center of the vacuum chamber 1 corresponds to the rotational center of the rotary table 2.

The vacuum chamber 1 includes a chamber body 12 having a cylindrical shape with a bottom, and a ceiling plate 11 that is detachably arranged on an upper surface of the chamber body 12 and is sealed airtight to the upper surface via a sealing member 13 such as an O-ring.

The rotary table 2 has a center portion that is fixed to a cylindrical core portion 21. The core portion 21 is fixed to an upper end of a rotary shaft 22 extending in the vertical direction. The rotary shaft 22 penetrates through a bottom portion 14 of the vacuum chamber 1 and has a lower end that is attached to a drive unit 23 for rotating the rotary shaft 22 around a vertical axis. The rotary shaft 22 and the drive unit 23 are accommodated in a cylindrical case 20 having an opening formed at its upper face. The case 20 has a flange portion formed at its upper face that is attached airtight to a bottom surface of the bottom portion 14 of the vacuum chamber 1, and in this way, an internal atmosphere within the case 20 may be maintained airtight from an external atmosphere of the case 20.

As illustrated in FIG. 2, a plurality (e.g., 5 in the illustrated example) of circular concave portions 24 that are capable of accommodating a plurality of semiconductor wafers corresponding to substrates (hereinafter referred to as "wafer W") are arranged along a rotational direction (circumferential direction) on the surface of the rotary table 2. Note that in FIG. 2, for convenience, the wafer W is illustrated in only one of the concave portions 24. The concave portion 24 has an inner diameter that is slightly larger (e.g., larger by 4 mm) than the diameter of the wafer W (e.g., 300 mm), and a depth that is approximately equal to the thickness of the wafer W. Thus, when the wafer W is placed in the concave portion 24, the surface of the wafer W and the surface of the rotary table 2 (i.e., surface of the region where the wafer W is not placed) may be substantially flush. Also, a number (e.g., 3) of through holes (not shown) are formed at a bottom face of the concave portion 24 such that lift pins (not shown) for supporting the rear face of the wafer W and lifting the wafer W may be arranged to penetrate through the through holes.

Also, as illustrated in FIG. 2, reaction gas nozzles 31 and 32, separation gas nozzles 41 and 42, and an activated gas supply unit 90 are arranged above the rotary table 2. In the illustrated example, the activated gas supply unit 90, the separation gas nozzle 41, the reaction gas nozzle 31, the separation gas nozzle 42, and the reaction gas nozzle 32 are spaced apart along the circumferential direction of the vacuum chamber 1 in this order as viewed clockwise (rotational direction of the rotary table 2) from a transfer port 15 (described below). Note that the reaction gas nozzle 31 is an example of a first reaction gas supply unit, and the reaction gas nozzle 32 is an example of a second reaction gas supply unit.

The reaction gas nozzles 31 and 32 respectively include a gas introduction ports 31a and 32a corresponding to base portions that are fixed to an outer peripheral wall of the chamber body 12. The reaction gas nozzles 31 and 32 are introduced into the vacuum chamber 1 from the outer peripheral wall of the vacuum chamber 1. Also, the reaction gas nozzles 31 and 32 are arranged to extend parallel with respect to the rotating table 2 along the radial directions of the chamber body 12.

The separation gas nozzles 41 and 42 respectively include gas introduction ports 41a and 42a corresponding to base portions that are fixed to the outer peripheral wall of the chamber body 12.

The separation gas nozzles 41 and 42 are introduced into the vacuum chamber 1 from the outer peripheral wall of the vacuum chamber 1. The separation gas nozzles 41 and 42 are arranged to extend parallel with respect to the rotary table 2 along the radial directions of the chamber body 12.

Note that the activated gas supply unit 90 is described below.

The reaction gas nozzle 31 may be made of quartz, for example, and is connected to a supply source of a Si (silicon)-containing gas that is used as a first reaction gas via a pipe and a flow regulator (not shown), for example. The reaction gas nozzle 32 may be made of quartz, for example, and is connected to a supply source of an oxidizing gas that is used as a second reaction gas via a pipe and a flow regulator (not shown), for example. The separation gas nozzles 41 and 42 are each connected to supply sources of separation gases via a pipe and a flow rate regulating valve (not shown), for example.

An organic amino silane gas may be used as the Si-containing gas, and $O_3$ (ozone) gas or $O_2$ (oxygen) gas may be used as the oxidizing gas, for example. Also, $N_2$ (nitrogen) gas and Ar (argon) gas may be used as the separation gases, for example.

The reaction gas nozzles 31 and 32 have a plurality of gas discharge holes 33 that open toward the rotary table 2 (see FIG. 3). The gas discharge holes 33 may be arranged at intervals of 10 mm, for example, along the length direction of the reaction gas nozzles 31 and 32, for example. A lower region of the reaction gas nozzle 31 corresponds to a first process region P1 for causing adsorption of the Si-containing gas to the wafer W. A lower region of the reaction gas nozzle 32 corresponds to a second process region P2 for oxidizing the Si-containing gas that has been adsorbed to the wafer W at the first process region P1.

Referring to FIG. 2, convex portions 4 protruding toward the rotary table 2 from bottom face regions of the ceiling plate 11 near the separation gas nozzles 41 and 42 are provided in the vacuum chamber 1. The convex portions 4 and the separation gas nozzles 41 and 42 form separation regions D. The convex portion 4 is fan-shaped in planar view and has a top portion that is cut into a circular arc shape. In the present embodiment, the inner arc of the convex portion 4 is connected to a protruding portion 5 (described below) and the outer arc of the convex portion 4 is arranged along an inner peripheral surface of the chamber body 12 of the vacuum chamber 1.

FIG. 3 is a partial cross-sectional view of the vacuum chamber 1 along a concentric circle of the rotary table 2 from the reaction gas nozzle 31 to the reaction gas nozzle 32. As illustrated in FIG. 3, the vacuum chamber 1 includes a first ceiling surface 44 corresponding to the bottom face of the convex portion 4 that is low and flat, and a second ceiling surface 45 that is higher than the first ceiling surface 44 and is arranged at both sides of the first ceiling surface 44 in the circumferential direction.

The first ceiling surface 44 is fan-shaped in planar view and has a top portion that is cut into a circular arc shape. Also, as illustrated in FIG. 3, a groove portion 43 extending in a radial direction is formed at the circumferential direction center of the convex portion 4, and the separation gas nozzle 42 is accommodated within this groove portion 43. Note that another groove portion 43 is similarly formed in the other convex portion 4, and the separation gas nozzle 41 is accommodated within this groove portion 43. Also, the reaction gas nozzles 31 and 32 are arranged in spaces below the higher second ceiling surface 45. The reaction gas nozzles 31 and 32 are spaced apart from the second ceiling surface 45 to be arranged close to the wafer W. Note that for convenience of explanation, the space below the higher second ceiling surface 45 where the reaction gas nozzle 31 is arranged is represented as "space 481", the space below the higher second ceiling surface 45 where the reaction gas nozzle 32 is arranged is represented as "space 482" (see FIG. 3).

The first ceiling surface 44 forms a separation space H corresponding to a narrow space between the first ceiling surface 44 and the surface of the rotary table 2. The separation space H can separate the Si-containing gas supplied from the first region P1 and the oxidizing gas supplied from the second region P2 from each other. Specifically, when $N_2$ gas is discharged from the separation gas nozzle 42, the $N_2$ gas discharged from the separation gas nozzle 42 flows toward the space 481 and the space 482 through the separation space H. At this time, because the $N_2$ gas flows through the narrow separation space H that has a smaller volume compared to the spaces 481 and 482, the pressure in the separation space H can be made higher than the pressure in the spaces 481 and 482. That is, a pressure barrier may be created between the spaces 481 and 482. Also, the $N_2$ gas flowing from the separation space H into the spaces 481 and 482 act as counter-flows against the flow of the Si-containing gas from the first area P1 and the flow of the oxidizing gas from the second region P2. Thus, the Si-containing gas and the oxidizing gas may be substantially prevented from flowing into the separation space H. In this way, the Si-containing gas and the oxidizing gas are prevented from mixing and reacting with each other in the vacuum chamber 1.

Referring to FIG. 2, the protruding portion 5 is arranged around an outer periphery of the core portion 21 that fixes the rotary table 2, and the protruding portion 5 is arranged on the bottom surface of the ceiling plate 11. In the present embodiment, the protruding portion 5 is connected to a rotational center side portion of the convex portion 4, and a bottom surface of the protruding portion 5 is arranged to be flush with the first ceiling surface 44.

Note that for convenience of explanation, FIG. 2 illustrates a cross-section of the chamber body 12 cut along a position that is higher than the second ceiling surface 45 and lower than the separation gas nozzles 41 and 42.

FIG. 1 referred to above is a cross-sectional view of the substrate processing apparatus along line I-I' of FIG. 2 illustrating a region where the second ceiling surface 45 is arranged. On the other hand, FIG. 4 is a partial cross-sectional view of the substrate processing apparatus illustrating a region where the first ceiling surface 44 is arranged.

As illustrated in FIG. 4, a bent portion 46 that is bent into an L-shape to face an outer edge face of the rotary table 2 is formed at a peripheral portion (portion toward the outer edge of the vacuum chamber 1) of the fan-shaped convex portion 4. The bent portion 46, like the convex portion 4, prevents the two reaction gases from entering the separation space H from both sides of the separation area D and prevents the two reaction gases from mixing with each other. The fan-shaped convex portion 4 is arranged at the ceiling plate 11, and the ceiling plate 11 is arranged to be detachable from the chamber body 12. Thus, a slight gap is formed between an outer peripheral face of the bent portion 46 and the chamber body 12. Note that dimensions of a gap between an inner peripheral face of the bent portion 46 and an outer edge face of the rotary table 2, and the gap between the outer peripheral face of the bent portion 46 and the chamber body 12 may be substantially the same as the height dimension of the first ceiling surface 44 with respect to the surface of the rotary table 2, for example.

In the separation region D, an inner peripheral wall of the chamber body 12 is arranged into a substantially vertical plane that is in close proximity with the outer peripheral face of the bent portion 46 as illustrated in FIG. 4. Note, however, that in regions other than the separation region D, the inner peripheral wall of the chamber body 12 may have a portion recessed outward from a region facing the outer edge face of the rotary table 12 to the bottom portion 14 as illustrated in FIG. 1, for example. In the following, for convenience of explanation, such a recessed portion having a rectangular cross section is referred to as "exhaust region E". More specifically, the exhaust region E that communicates with the first process region P1 is referred to as "first exhaust region E1", and the exhaust region E that communicates with the second process region P2 is referred to as "second exhaust region E2" as illustrated in FIG. 2. Further, a first exhaust port 61 and a second exhaust port 62 are respectively formed at the bottom of the first exhaust region E1 and the second exhaust region E2. As illustrated in FIG. 1, the first exhaust port 61 and the second exhaust port 62 are each connected to a vacuum exhaust unit such as a vacuum pump 64 via an exhaust pipe 63. Also, a pressure regulating unit 65 is arranged at the exhaust pipe 63.

As illustrated in FIGS. 1 and 4, a heater unit 7 as a heating unit may be arranged in a space between the rotary table 2 and the bottom portion 14 of the vacuum chamber 1, and a wafer W arranged on the rotary table 2 may be heated to a predetermined temperature according to a process recipe via the rotary table 2. Also, a ring-shaped cover member 71 for preventing gas from entering a lower region of the rotary table 2 is arranged at a lower side of a peripheral edge portion of the rotary table 2. The cover member 71 acts as a partition member for separating the atmosphere of a region extending from the space above the rotary table 2 to the exhaust regions E1 and E2 and the atmosphere of a space where the heater unit 7 is arranged.

The cover member 71 includes an inner member 71a that faces an outer edge portion of the rotary table 2 and a portion extending further outward from this outer edge portion from the lower side, and an outer member 71b that is arranged between the inner member 71a and an inner wall face of the vacuum chamber 1. In the separation region D, the outer member 71b is arranged near the bent portion 46, at the lower side of the bent portion 46, which is formed at the outer edge portion of the convex portion 4. The inner member 71a surrounds the entire periphery of the heater unit 7 at the lower side of the outer edge portion of the rotary table 2 (and the portion extending slightly outward from the outer edge portion).

A protruding portion 12a is formed at a part of the bottom portion 14 toward the rotational center side of the space where the heater unit 7 is disposed. The protrusion 12a protrudes upward toward the core portion 21 at a center portion of the bottom surface of the rotary table 2. A narrow space is formed between the protrusion 12a and the core portion 21. Also, a narrow space is provided between an outer peripheral face of the rotary shaft 22 that penetrates through the bottom portion 14 and an inner peripheral face of a through hole for the rotary shaft 22. Such narrow spaces are arranged to be in communication with the case 20. Further, a purge gas supply pipe 72 for supplying $N_2$ gas as a purge gas is arranged at the case 20.

Also, a plurality of purge gas supply pipes 73 for purging the space accommodating the heater unit 7 are arranged at the bottom portion 14 of the vacuum chamber 1 at intervals of a predetermined angle along the circumferential direction below the heater unit 7 (only one of the purge gas supply pipes 73 is illustrated in FIG. 4). Also, a lid member 7a is arranged between the heater unit 7 and the rotating table 2 in order to prevent gas from entering the region where the heater unit 7 is located. The lid member 7a extends in the circumferential direction to cover a region between an inner wall of the outer member 71b (upper face of the inner member 71a) and an upper edge portion of the protrusion 12a. The lid member 7a may be made of quartz, for example.

Also, a separation gas supply pipe 51 is connected to a center portion of the ceiling plate 11 of the vacuum chamber 1. The separation gas supply pipe 51 supplies $N_2$ gas as a separation gas to a space 52 between the ceiling plate 11 and the core portion 21. The separation gas supplied to the space 52 is discharged toward the periphery of the rotary table 2 along a wafer mounting area side surface of the rotary table 2 via a narrow space 50 between the protruding portion 5 and the rotary table 2. The pressure within the space 50 can be maintained at a higher pressure than the pressure within the space 481 and the space 482 by the separation gas. That is, by providing the space 50, the Si-containing gas supplied to the first process region P1 and the oxidizing gas supplied to the second process region P2 may be prevented from passing through a center region C (see FIG. 1) to mix with each other. In other words, the space 50 (or the center region C) may have a function similar to that of the separation space H (or separation region D).

Further, as illustrated in FIG. 2, the transfer port 15 for transferring the wafer W corresponding to a substrate between an external transfer arm 10 and the rotary table 2 is arranged at a side wall of the vacuum chamber 1. The transfer port 15 may be opened/closed by a gate valve (not shown). Note that the wafer W may be transferred back and forth between the concave portion 24 corresponding to the wafer mounting region of the rotary table 2 and the transfer arm 10 when the concave portion 24 is positioned to face the transfer port 15. Accordingly, lift pins that penetrate through the concave portion 24 to lift the wafer W from its rear face and a lift mechanism for the lift pins (not shown) are arranged at a portion below the rotary table 2 corresponding to a transfer position for transferring the wafer W.

Figure 5:
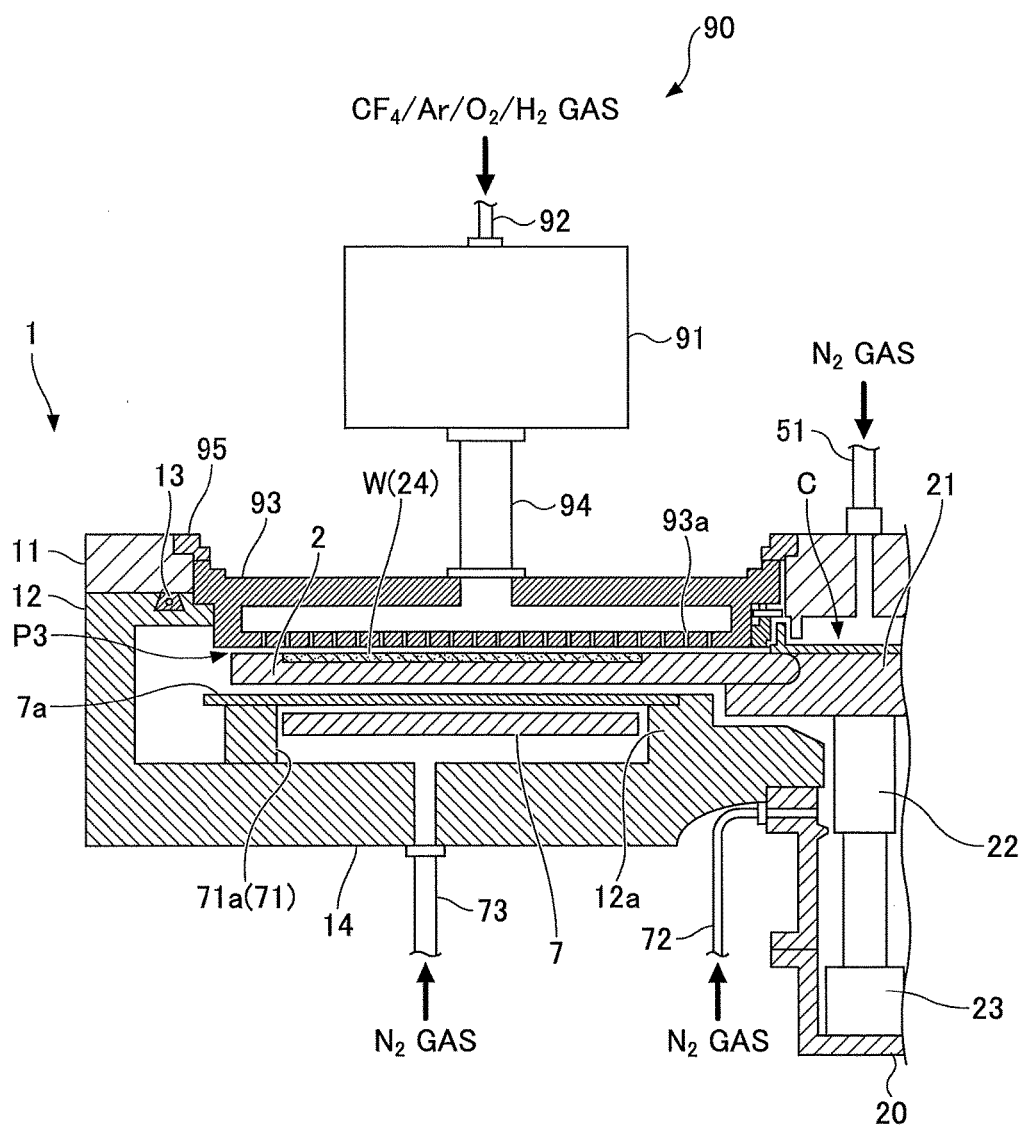
FIG. 5 is a partial cross-sectional view illustrating a third process region of the substrate processing apparatus.
Figure 6:
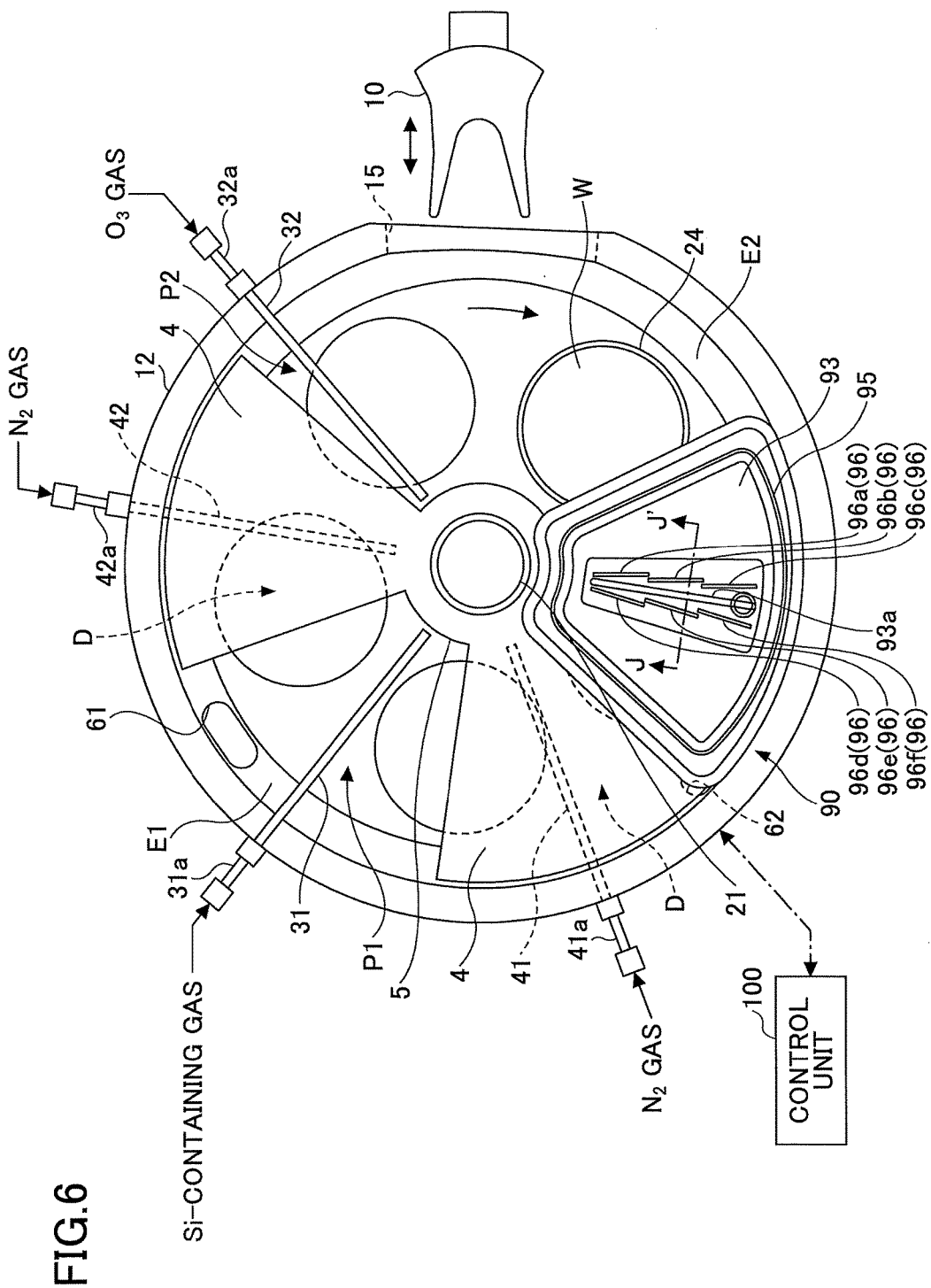
FIG. 6 another schematic plan view of the substrate processing apparatus.
Figure 7:
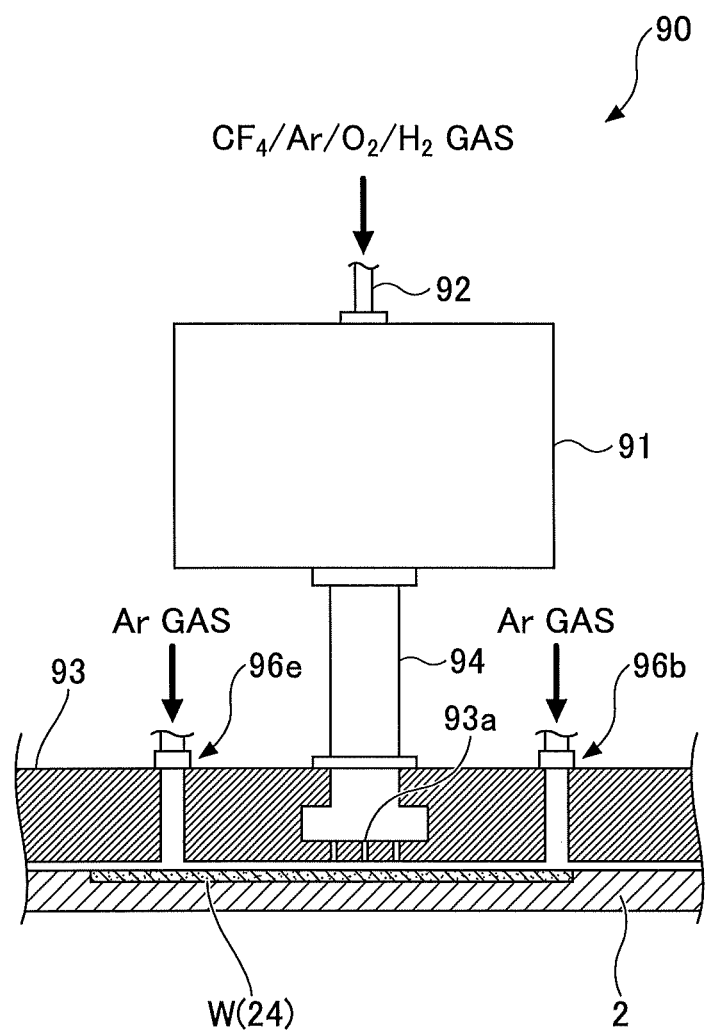
FIG. 7 a partial cross-sectional view illustrating purge gas supply units of the substrate processing apparatus.

In the following, the activated gas supply unit 90 is described with reference to FIGS. 2 and 5-7. FIG. 5 is a partial cross-sectional view illustrating a third process region P3 of the substrate processing apparatus according to the present embodiment. FIG. 6 is a schematic plan view of the substrate processing apparatus according to the present embodiment. FIG. 7 is a partial cross-sectional view illustrating purge gas supply units 96 of the substrate processing apparatus according to the present embodiment. Note that FIG. 6 illustrates a state in which the plasma generation unit 91 and the etching gas supply unit 92 are removed from the substrate processing apparatus illustrated in FIG. 2. Also, FIG. 7 illustrates a cross-section of FIG. 6 along line J-J'.

The activated gas supply unit 90 supplies an activated etching gas to a film formed on the wafer W to etch the film. As illustrated in FIGS. 2 and 5, the activated gas supply unit 90 includes a plasma generation unit 91, an etching gas supply pipe 92, a shower head unit 93, and a pipe 94. Note that the shower head unit 93 is an example of a discharge unit.

The plasma generation unit 91 activates an etching gas supplied from the etching gas supply pipe 92 using a plasma source. The plasma source is not particularly limited as long as it is capable of activating the fluorine-containing gas to generate F (fluorine) radicals. For example, an inductively coupled plasma (ICP), a capacitively coupled plasma (CCP), or a surface wave plasma (SWP) may be used as the plasma source.

The etching gas supply pipe 92 has one end that is connected to the plasma generation unit 91 and is configured to supply the etching gas to the plasma generation unit 91. The other end of the etching gas supply pipe 92 may be connected to an etching gas supply source that stores the etching gas via an on-off valve and a flow regulator, for example. Note that a gas that is capable of etching the film formed on the wafer W may be used as the etching gas. Specifically, for example, fluorine-containing gases including hydrofluorocarbons such as $CHF_3$ (trifluoromethane), fluorocarbons such as $CF_4$ (carbon tetrafluoride) for etching a silicon oxide film may be used. Further, gases such as Ar gas, $O_2$ gas, and/or $H_2$ (hydrogen) gas may be added to these fluorine-containing gases at appropriate amounts, for example.

The shower head unit 93 is connected to the plasma generation unit 91 via the pipe 94. The shower head unit 93 supplies the etching gas that has been activated by the plasma generation unit 91 into the vacuum chamber 1. The shower head unit 93 is fan-shaped in planar view and is pressed downward along the circumferential direction by a press member 95 that is formed along the outer edge of the fan shape. The press member 95 is fixed to the ceiling plate 11 by a bolt or the like (not shown), and in this way, the internal atmosphere of the vacuum chamber 1 may be maintained airtight. The distance between a bottom face of the shower head unit 93 when it is secured to the ceiling plate 11 and a surface of the rotary table 2 may be arranged to be about 0.5 mm to 5 mm, for example. A lower region of the shower head unit 93 corresponds to the third process region P3 for etching a silicon oxide film, for example. In this way, F radicals contained in the activated etching gas that is supplied into the vacuum chamber 1 via the shower head unit 93 may efficiently react with the film formed on the wafer W.

A plurality of gas discharge holes 93a are arranged at the shower head unit 93. In view of the difference in angular velocity of the rotary table 2, a smaller number of the gas discharge holes 93a are arranged at a rotational center side of the shower head unit 93, and a larger number of the gas discharge holes 93a are arranged at an outer periphery side of the shower head unit 93. The total number of the gas discharge holes 93a may be several tens to several hundreds, for example. Also, the diameter of the plurality of gas discharge holes 93a may be about 0.5 mm to 3 mm, for example. The activated fluorine-containing gas supplied to the shower head unit 93 may be supplied to the space between the rotary table 2 and the shower head unit 93 via the gas discharge holes 93a.

The pipe 94 connects the plasma generation unit 91 and the shower head unit 93.

Also, as illustrated in FIGS. 6 and 7, three purge gas supply units 96 (96a, 96b, 96c) are arranged in front of the gas discharge holes 93a with respect to the circumferential direction of the vacuum chamber 1 (upstream side with respect to the rotational direction of the rotary table 2). The purge gas supply units 96a-96c are arranged close to the gas discharge holes 93a to form integral parts of the shower head unit 93.

The purge gas supply units 96a-96c are arranged along a radial direction of the chamber body 12 so as to extend horizontally with respect to the rotary table 2, and a purge gas is supplied to a space between the rotary table 2 and the shower head unit 93. Each of the purge gas supply units 96a-96c may be connected to an open/close valve and a flow regulator, for example, such that supply flow rate of the purge gas may be independently controlled at each of the purge gas supply units 96a-96c. The flow rate of the purge gas supplied from each of the purge gas supply units 96 is controlled based on the distribution of the etching gas supplied to the surface of the rotary table 2 by the activated gas supply unit 90.

The purge gas supply unit 96a is arranged more toward the rotational center side than the purge gas supply unit 96b along the radial direction of the chamber body 12. The purge gas supply unit 96b is arranged more toward the rotational center side than the purge gas supply unit 96c along the radial direction of the chamber body 12.

By supplying the purge gas from the purge gas supply units 96a-96c, the volume fraction of fluorine contained in the etching gas supplied from the gas discharge holes 93a to the space between the rotary table 2 and the shower head unit 93 may be reduced. Note that gases such as Ar gas or a gas mixture of Ar gas and $H_2$ gas (hereinafter referred to as "Ar/$H_2$ gas") may be used as the purge gas, but Ar/$H_2$ gas is preferably used as the purge gas. In this way, F radicals react with the $H_2$ gas to generate HF (hydrogen fluoride) such that the amount of F radicals is reduced. That is, the concentration of F radicals may be controlled.

Also, as illustrated in FIGS. 6 and 7, three purge gas supply units 96 (96d, 96e, 96f) are arranged behind the gas discharge holes 93a with respect to the circumferential direction of the vacuum chamber 1 (downstream side with respect to the rotational direction of the rotary table 2). The purge gas supply units 96d-96f are likewise arranged close to the gas discharge holes 93a to form integral parts of the shower head unit 93.

The purge gas supply units 96d-96f are arranged along a radial direction of the chamber body 12 to extend horizontally with respect to the rotary table 2, and a purge gas is supplied to a space between the rotary table 2 and the shower head portion 93. Each of the purge gas supply units 96d-96f may be connected to an open/close valve and a flow regulator, for example, such that the supply flow rate of the purge gas may be independently controlled at each of the purge gas supply units 96d-96f.

The purge gas supply unit 96d is arranged more toward the rotational center side than the purge gas supply unit 96e along the radial direction of the chamber body 12. The purge gas supply unit 96e is arranged more toward the rotational center side than the purge gas supply unit 96f in the radial direction of the chamber body 12.

By supplying the purge gas from the purge gas supply units 96d-96f, the volume fraction of fluorine contained in the etching gas supplied from the gas discharge holes 93a to the space between the rotary table 2 and the shower head unit 93 may be reduced. Note that the same gas as that supplied by the purge gas supply units 96a-96c such as Ar gas or preferably Ar/$H_2$ gas may be used as the purge gas supplied by the purge gas supply units 96d-96f, for example.

Note that in FIG. 6, three purge gas supply units 96 are arranged in front of the gas discharge holes 93a and three purge gas supply units 96 are arranged behind the gas discharge holes 93a with respect to the circumferential direction of the vacuum chamber 1. However, the present invention is not limited to such an arrangement. For example, all of the purge gas supply units 96 may be arranged only in front of the gas discharge holes 93a with respect to the circumferential direction of the vacuum chamber 1, or all of the purge gas supply units 96 may be arranged only behind the gas discharge holes 93a with respect to the circumferential direction. Also, the number of the purge gas supply units 96 arranged at the shower head unit 93 may be any number greater than or equal to two.

Also, the substrate processing apparatus of the present embodiment includes a control unit 100 configured by a computer that performs overall control operations of the substrate processing apparatus. The control unit 100 includes a memory that stores a program for causing the substrate processing apparatus to implement a substrate processing method according to an embodiment of the present invention (described below) under control of the control unit 100. The program includes a set of steps set for performing operations of the substrate processing apparatus (described below) and may be installed in the control unit 100 from a storage unit 101 such as a hard disk, a compact disk, an optical disk, a memory card, a flexible disk, or some other type of computer-readable storage medium.

(Substrate Processing Method)

In the following, an exemplary substrate processing method using the substrate processing apparatus according to the above-described embodiment is described. Hereinafter, a method of forming a $SiO_2$ film in a via hole corresponding to an example of a concave pattern that is formed in the wafer W is described as an example. Also, note that in the example described below, it is assumed that a Si-containing gas is used as the first reaction gas, an oxidizing gas is used as the second reaction gas, and a gas mixture of $CF_4$, Ar gas, $O_2$ gas, and $H_2$ gas (hereinafter referred to as "$CF_4/Ar/O_2/H_2$ gas") is used as the etching gas.

First, a gate valve (not shown) is opened, and a wafer W is transferred from the exterior by the transfer arm 10 via the transfer port 15 to be placed within one of the concave portions 24 of the rotary table 2 as illustrated in FIG. 2. The transfer of the wafer W may be accomplished by lifting the lift pins (not shown) from the bottom side of the vacuum chamber 1 via the through holes that are formed at the bottom face of the concave portion 24 when the concave portion 24 comes to a halt at a position facing the transfer port 15. Such a transfer of the wafer W may be performed with respect to each of the five concave portions 24 of the rotary table 2 by intermittently rotating the rotary table 2 to place a wafer W in each of the concave portions 24, for example.

Then, the gate valve is closed, and air is drawn out of the interior of the vacuum chamber 1 by the vacuum pump 64. Then, $N_2$ gas as a separation gas is discharged at a predetermined flow rate from the separation gas nozzles 41 and 42, and $N_2$ gas is discharged at a predetermined flow rate from the separation gas supply pipe 51 and the purge gas supply pipes 72 and 73. In turn, the pressure regulating unit 65 adjusts the pressure within the vacuum chamber 1 to a preset processing pressure. Then, the heater unit 7 heats the wafers W up to 450° C., for example, while the rotary table 2 is rotated clockwise at a rotational speed of 60 rpm, for example.

Then, a film forming process is performed. In the film forming process, a Si-containing gas is supplied from the reaction gas nozzle 31, and an oxidizing gas is supplied from the reaction gas nozzle 32. Note that in this process, no gas is supplied from the activated gas supply unit 90.

When one of the wafers W passes the first process region P1, the Si-containing gas as a source gas that is supplied from the reaction gas nozzle 31 is adsorbed to the surface of the wafer W. Then, as the rotary table 2 is rotated, the wafer W having the Si-containing gas adsorbed to its surface passes the separation region D including the separation gas nozzle 42 where the wafer W is purged. Thereafter, the wafer W enters the second process region P2. In the second process region P2, the oxidizing gas is supplied from the reaction gas nozzle 32, and Si components contained in the Si-containing gas is oxidized by the oxidizing gas. As a result, $SiO_2$ corresponding to a reaction product of the oxidization is deposited on the surface of the wafer W.

The wafer W that has passed the second process region P2 passes the separation region D including the separation gas nozzle 41 where the wafer W is purged. Then, the wafer W enters the first process region P1 once again. Then, the Si-containing gas that is supplied from the reaction gas nozzle 31 is adsorbed to the surface of the wafer W.

As described above, in the film forming process, the rotary table 2 is consecutively rotated a plurality of times while supplying the first reaction gas and the second reaction gas into the vacuum chamber 1 but without supplying a fluorine-containing gas into the vacuum chamber 1. In this way, $SiO_2$ corresponding to the reaction product may be deposited on the surface of the wafer W and a $SiO_2$ film (silicon oxide film) may be formed on the wafer W surface.

Also, if necessary or desired, after the $SiO_2$ film has been formed to a predetermined thickness, the supply of the Si-containing gas from the reaction gas nozzle 31 may be stopped but the oxidizing gas may continuously be supplied from the reaction gas nozzle 32 while rotation of the rotary table 2 is continued. In this way, a modification process may be performed on the $SiO_2$ film. By executing the film forming process as described above, the $SiO_2$ film may be formed in a via hole corresponding to one example of a concave pattern. The $SiO_2$ film that is first formed in the via hole may have a cross-sectional shape substantially corresponding to the concave shape of the via hole.

Then, an etching process is performed. In the etching process, the $SiO_2$ film is etched to have a V-shaped cross-sectional shape. In the following, specific process steps of the etching process are described.

As shown in FIG. 2, the supply of the Si-containing gas and the oxidizing gas from the reaction gas nozzles 31 and 32 are stopped, and $N_2$ gas as a purge gas is supplied. The temperature of the rotary table 2 is set to a temperature of about 600° C., for example, that is suitable for etching. The rotation speed of the rotary table 2 may be set to 60 rpm, for example. In such a state, the $CF_4/Ar/O_2/H_2$ gas is supplied from the shower head unit 93 of the activated gas supply unit 90, Ar gas is supplied from the hydrogen-containing gas supply unit 96 at a preset flow rate, for example, and the etching process is started.

Note that at this time, the rotary table 2 is rotated at a relatively low speed such that the $SiO_2$ film may be etched to have a V-shaped cross-sectional shape. By etching the SiO2 film in the via hole into a V-shape, a hole having a wide opening at its top portion may be formed in the $SiO_2$ film, and in this way, when embedding a $SiO_2$ film in the hole in a subsequent film forming process, the $SiO_2$ may reach the bottom of the hole such that bottom-up characteristics may be improved and void generation may be prevented in the film forming process.

Note that when etching the SiO2 film in the etching process, the etching amount may vary depending on the etching location, namely, from the rotational center side to the outer periphery side of the wafer W surface. When such a variation in the etching amount is created in the wafer W surface, it is difficult to secure etching uniformity in the wafer W surface.

In view of the above, the substrate processing apparatus according to the present embodiment has a plurality of purge gas supply units 96 arranged on at least one side of the gas discharge holes 93a with respect to the circumferential direction of the vacuum chamber 1. By arranging the purge gas supply units 96 in this manner, Ar gas may be supplied to the space between the rotary table 2 and the shower head unit 93 at a preset flow rate, for example. Also, the flow rate of the Ar gas supplied from each of the plurality of purge gas supply units 96 may be independently controlled such that the etching amount distribution within the wafer W surface may be adjusted.

Specifically, when the etching amount at the rotational center side of the wafer W surface is large, the flow rate of the Ar gas supplied from the purge gas supply unit 96a may be adjusted to be greater than the flow rate of the Ar gas supplied from the purge gas supply units 96b and 96c. Note that in the above case, the flow rate of the Ar gas supplied from the purge gas supply unit 96d may be adjusted to be greater than the flow rate of the Ar gas supplied from the purge gas supply units 96e and 96f instead. Moreover, both the Ar gas flow rates of the purge gas supply units 96a and 96d may be adjusted to be greater than the Ar gas flow rates of the other purge gas supply units 96.

Also, when the etching amount at the outer periphery side of the wafer W surface is large, the flow rate of the Ar gas supplied from the purge gas supply unit 96c may be adjusted to be greater than the flow rate of the Ar gas supplied from the purge gas supply units 96a and 96b. Note that in the above case, the flow rate of the Ar gas supplied from the purge gas supply unit 96f may be adjusted to be greater than the flow rate of the Ar gas supplied from the purge gas supply units 96d and 96e instead. Further, both the Ar gas flow rates of the purge gas supply units 96c and 96f may be adjusted to be greater than the other purge gas supply units 96.

Note that the flow rate of the Ar gas supplied from each of the purge gas supply units 96 may be controlled by the control unit 100 to flow at preset flow rate, or the flow rate may be controlled by an operator of the substrate processing apparatus, for example.

As described above, in the etching process, the rotary table 2 is rotated consecutively a plurality of times while supplying the etching gas and the purge gas into the vacuum chamber 1 but without supplying the first reaction gas and the second reaction gas into the vacuum chamber 1. In this way, the $SiO_2$ film may be etched.

Then, the above-mentioned film forming process is performed again. In this film forming process, another $SiO_2$ film is formed on the $SiO_2$ film that has been etched into a V-shape in the above etching process to increase the film thickness. Because a film is formed on the $SiO_2$ film that has been etched into a V-shape, the opening of the hole in the $SiO_2$ film may be prevented from closing during film formation such that the film may be formed from the bottom portion of the $SiO_2$ film.

Then, the above-mentioned etching process is performed again. In the etching process, the $SiO_2$ film is etched into a V-shape.

The above-described film forming process and etching process may be alternately performed as many times as necessary to embed the via hole while preventing the generation of a void in the $SiO_2$ film.

The number of times these processes are repeated may be adjusted to a suitable number according to the shape of the concave pattern (e.g. via hole) such as the aspect ratio of the concave pattern. For example, the number of repetitions may be increased as the aspect ratio is increased. Also, the number of repetitions is expected to be greater when embedding a via hole as compared to embedding a trench, for example.

Note that in the present embodiment, the film forming process and the etching process are repeatedly performed to embed a film in a concave pattern that is formed in the surface of the wafer W. However, the present invention is not limited thereto.

For example, a wafer W already having a film formed on its surface may be transferred and loaded in the substrate processing apparatus, and only the etching process may be performed on the wafer W.

Also, in some examples, the first reaction gas, the second reaction gas, the etching gas, and the purge gas may be simultaneously supplied into the vacuum chamber 1 while consecutively rotating the rotary table 2 a plurality of times, and the film forming process and the etching process may each be performed once during one rotation cycle of the rotary table 2. Further, in some examples, a cycle of performing each of the film forming process and the etching process once may be repeated a plurality of times.

Examples

In the following, results of simulations and experiments conducted using the substrate processing apparatus according to the above-described embodiment are described.

FIGS. 8A-8D are diagrams showing simulation results of the fluorine volume fraction within the vacuum chamber 1 when $CF_4$ gas, Ar gas, $O_2$ gas, and $H_2$ gas (hereinafter referred to as "$CF_4/Ar/O_2/H_2$ gas") are supplied from the activated gas supply unit 90, and Ar gas is supplied from the purge gas supply units 96 (96a, 96b, 96c) that are arranged in front of the activated gas supply unit 90 with respect to the circumferential direction of the vacuum chamber 1.

The following simulation conditions were used in the present experiment. That is, the pressure of the vacuum chamber 1 was set to 2 Torr, and the temperature of the rotary table 2 was set to 600° C., and the rotational speed of the rotary table 2 was set to 60 rpm. Also, the Ar gas flow rate of the separation gas supply pipe 51 was set to 0.5 slm, and the Ar gas flow rate of the purge gas supply pipe 73 was set to 1 slm. Also, at the etching gas supply pipe 92, the $CF_4$ gas flow rate was set to 10 sccm, the Ar gas flow rate was set to 4 slm, the $O_2$ gas flow rate was set to 30 sccm, and the $H_2$ gas flow rate was set to 20 sccm.

Under the above conditions, the flow rate of the Ar gas supplied from the purge gas supply units 96a, 96b, and 96c were varyingly set to 100 sccm or 300 sccm, and the fluorine volume fraction within the vacuum chamber 1 was simulated.

Figure 8A:
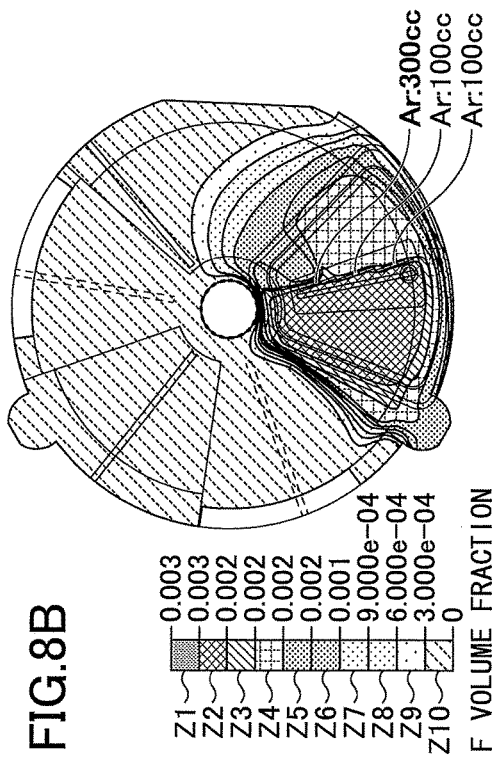
FIGS. 8A-8D are diagrams showing simulation results of a fluorine volume fraction within a vacuum chamber during an etching process.

FIG. 8A is a diagram showing the simulation result in the case where the flow rates of the Ar gas supplied from the purge gas supply units 96a, 96b, and 96c were all set to 100 sccm.

Figure 8B:
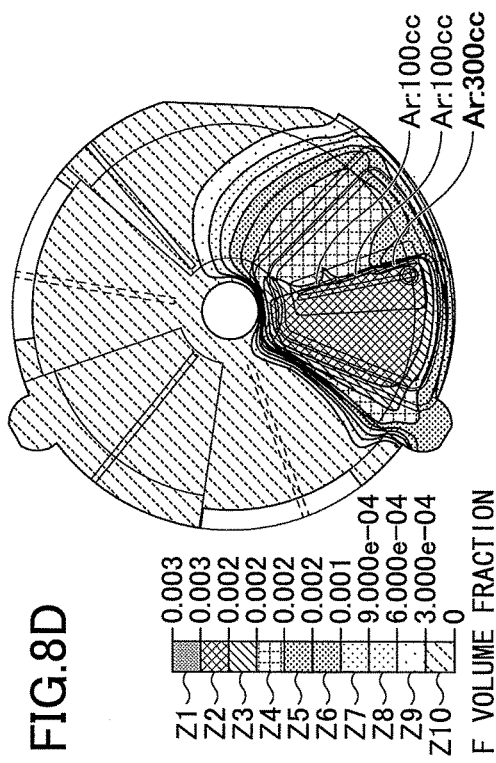
Figure 8C:
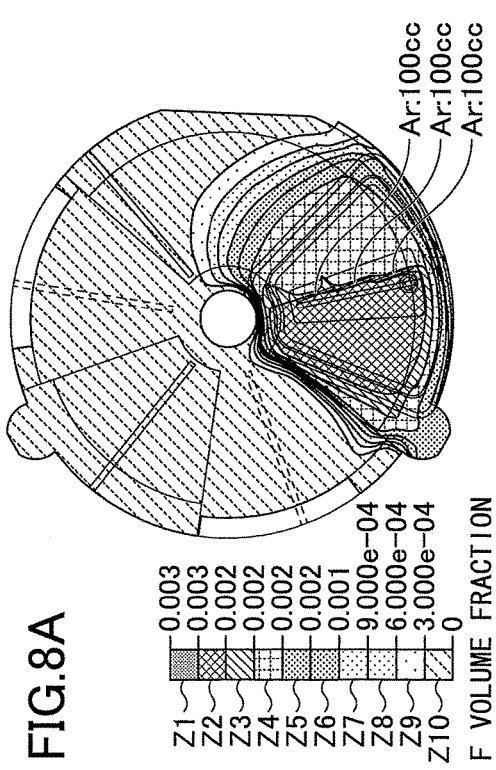
Figure 8D:
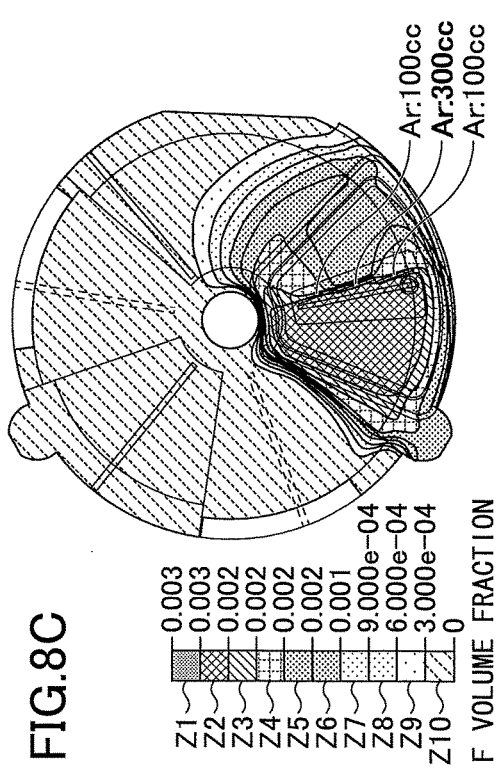

FIG. 8B is a diagram showing the simulation result in the case where the flow rate of the Ar gas supplied from the purge gas supply unit 96a was set to 300 sccm, and the flow rates of the Ar gas supplied from the purge gas supply units 96b and 96c were set to 100 sccm. FIG. 8C is a diagram showing the simulation result in the case where the flow rate of the Ar gas supplied from the purge gas supply unit 96b was set to 300 sccm, and the flow rates of the Ar gas supplied from the purge gas supply units 96a and 96c were set to 100 sccm. FIG. 8D is a diagram showing the simulation result in the case where the flow rate of the Ar gas supplied from the purge gas supply unit 96c was set to 300 sccm, and the flow rates of the Ar gas supplied from the purge gas supply units 96a and 96b were set to 100 sccm.

In FIGS. 8A-8D, region Z1 represents a region with the highest fluorine volume fraction. Further, the fluorine volume fraction being represented decreases from region Z2 to region Z3, from region Z3 to region Z4, from region Z4 to region Z5, from region Z5 to region Z6, from region Z6 to region Z7, from region Z7 to region Z8, from region Z8 to region Z9, and from region Z9 to region Z10.

Referring to FIGS. 8A-8D, it can be appreciated that in regions located in front of the purge gas supply units 96 with respect to the circumferential direction, the fluorine volume fraction is lower in the case where the Ar gas flow rate is set to 300 sccm as compared to the case where the Ar gas flow rate is set to 100 sccm. More specifically, in FIGS. 8B-8D as compared to FIG. 8A, the area of region Z4 is smaller and the areas of regions Z5 and Z6 are larger in the region located in front of the purge gas supply unit 96 that has been set up to supply the Ar gas at the flow rate of 300 sccm. That is, by increasing the Ar gas flow rate of one or more of the purge gas supply units 96, the fluorine volume fraction may be decreased in the region located in front of the purge gas supply unit 96 that has been set up to supply the Ar gas at the increased flow rate. As a result, the silicon oxide film etching amount in the corresponding region may be reduced.

Figure 9A:
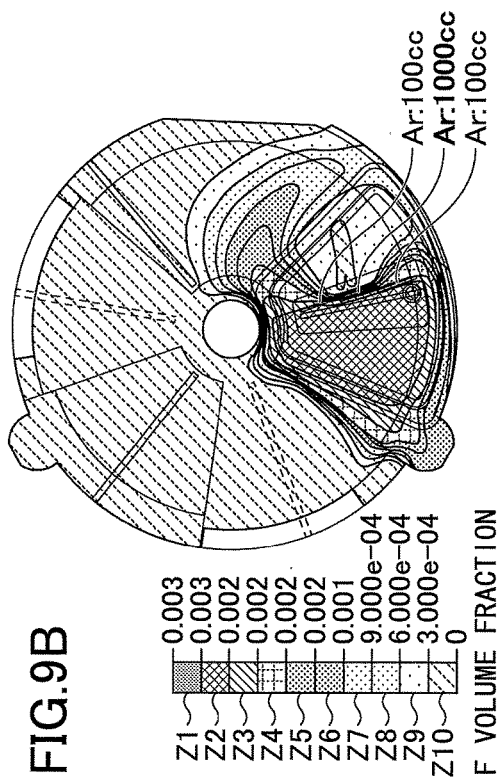
FIGS. 9A-9C are diagrams showing other simulation results of the fluorine volume fraction within the vacuum chamber during an etching process.
Figure 9C:
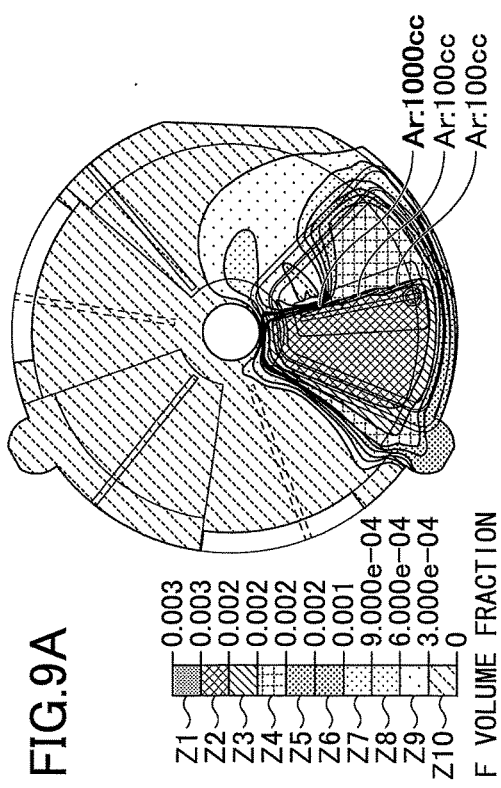
Figure 9B:
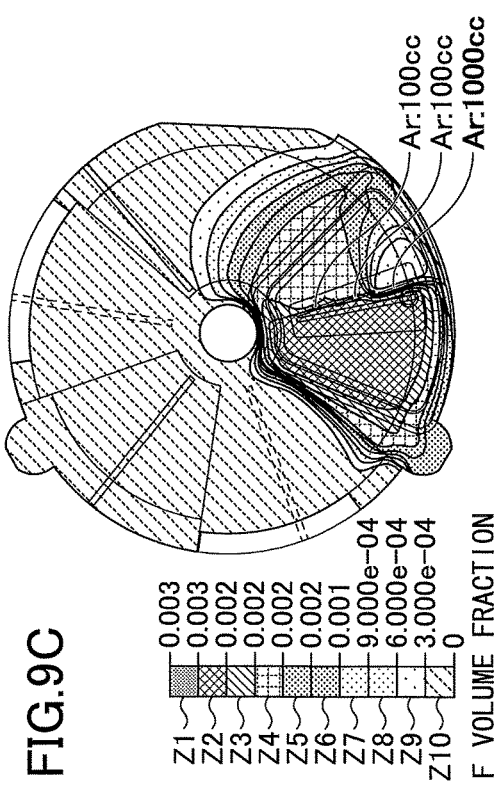

FIGS. 9A-9C are diagrams similar to FIGS. 8A-8D showing simulation results of the fluorine volume fraction within the vacuum chamber 1 when the $CF_4/Ar/O_2/H_2$ gas is supplied from the activated gas supply unit 90, and Ar gas is supplied from the purge gas supply units 96 (96a, 96b, 96c) that are arranged in front of the activated gas supply unit 90 with respect to the circumferential direction of the vacuum chamber 1. Note that in FIGS. 9A-9C, simulation conditions similar to those of FIGS. 8A-8D were used, but the flow rates of Ar gas supplied from the purge gas supply units 96a-96c were varyingly set to 100 sccm or 1000 sccm, and the fluorine volume fraction within the vacuum chamber 1 was simulated under these conditions.

FIG. 9A is a diagram showing the simulation result in the case where the flow rate of the Ar gas supplied from the purge gas supply unit 96a was set to 1000 sccm, and the flow rates of the Ar gas supplied from the purge gas supply units 96b and 96c were set to 100 sccm. FIG. 9B is a diagram showing the simulation result in the case where the flow rate of the Ar gas supplied from the purge gas supply unit 96b was set to 1000 sccm, and the flow rates of the Ar gas supplied from the purge gas supply units 96a and 96c were set to 100 sccm. FIG. 9C is a diagram showing the simulation result in the case where the flow rate of the Ar gas supplied from the purge gas supply unit 96c was set to 1000 sccm, and the flow rates of the Ar gas supplied from the purge gas supply units 96a and 96b were set to 100 sccm.

In FIGS. 9A-9C, region Z1 represents a region where the fluorine volume fraction is the highest. Further, the fluorine volume fraction being represented decreases from region Z2 to region Z3, from region Z3 to region Z4, from region Z4 to region Z5, from region Z5 to region Z6, from region Z6 to region Z7, from region Z7 to region Z8, from region Z8 to region Z9, and from region Z9 to region Z10.

Referring to FIG. 8A and FIGS. 9A-9C, it can be appreciated that in the regions located in front of the purge gas supply units 96 with respect to the circumferential direction, the fluorine volume fraction is lower in the case where the Ar gas flow rate is set to 1000 sccm as compared to the case where the Ar gas flow rate is set to 100 sccm. More specifically, in FIGS. 9A-9C as compared to FIG. 8A, the area of region Z4 is smaller and the areas of regions Z5 and Z6 are larger in the region located in front of the purge gas supply unit 96 that has been set up to supply the Ar gas at the flow rate of 1000 sccm. That is, by increasing the Ar gas flow rate of one or more of the purge gas supply units 96, the fluorine volume fraction may be decreased in the region located in front of the purge gas supply unit 96 that has been set up to supply the Ar gas at the increased flow rate. As a result, the silicon oxide film etching amount in the corresponding region may be reduced. Further, by increasing the Ar gas flow rate from 300 sccm to 1000 sccm, the fluorine volume fraction may be further decreased as compared to the case where the Ar gas flow rate is set to 300 sccm.

FIGS. 10A-10D are diagrams showing simulation results of the fluorine volume fraction within the vacuum chamber 1 when the $CF_4/Ar/O_2/H_2$ gas is supplied from the activated gas supply unit 90, and Ar gas is supplied from the purge gas supply units 96 (96d, 96e, 96f) that are arranged behind the activated gas supply unit 90 with respect to the circumferential direction of the vacuum chamber 1. Note that in FIGS. 10A-10D, the flow rates of Ar gas supplied from the purge gas supply units 96d-96f were varyingly set to 100 sccm or 300 sccm under simulation conditions similar to those of FIGS. 8A-8D, and the fluorine volume fraction within the vacuum chamber 1 was simulated under these conditions.

FIG. 10A is a diagram showing the simulation result in the case where the Ar gas flow rates of the purge gas supply units 96d-96f were all set to 100 sccm. FIG. 10B is a diagram showing the simulation result in the case where the flow rate of the Ar gas supplied from the purge gas supply unit 96d was set to 300 sccm, and the flow rates of the Ar gas supplied from the purge gas supply units 96e and 96f were set to 100 sccm. FIG. 10C is a diagram showing the simulation result in the case where the flow rate of the Ar gas supplied from the purge gas supply unit 96e was set to 300 sccm, and the flow rates of the Ar gas supplied from the purge gas supply units 96d and 96f were set to 100 sccm. FIG. 10D is a diagram showing the simulation result in the case where the flow rate of the Ar gas supplied from the purge gas supply unit 96f was set to 300 sccm, and the flow rates of the Ar gas supplied from the purge gas supply units 96d and 96e were set to 100 sccm.

In FIGS. 10A-10D, region Z1 represents a region where the fluorine volume fraction is the highest. Further, the fluorine volume fraction being represented decreases from region Z2 to region Z3, from region Z3 to region Z4, from region Z4 to region Z5, from region Z5 to region Z6, from region Z6 to region Z7, from region Z7 to region Z8, from region Z8 to region Z9, and from region Z9 to region Z10.

Referring to FIGS. 10A-10D, it can be appreciated that in regions located behind the purge gas supply units 96 with respect to the circumferential direction, the fluorine volume fraction is lower in the case where the Ar gas flow rate is set to 300 sccm as compared to the case where the Ar gas flow rate is set to 100 sccm. More specifically, in FIGS. 10B-10D as compared to FIG. 10A, the area of region Z4 is smaller and the areas of regions Z5 and Z6 are larger in the region located behind the purge gas supply unit 96 that has been set up to supply the Ar gas at the flow rate of 300 sccm. That is, by increasing the Ar gas flow rate of one or more of the purge gas supply units 96, the fluorine volume fraction may be decreased in the region located behind the purge gas supply unit 96 that has been set up to supply the Ar gas at the increased flow rate. As a result, the silicon oxide film etching amount in the corresponding region may be reduced. Further, by arranging the purge gas supply units 96 behind the activated gas supply unit 90 with respect to the circumferential direction, Ar gas that is supplied from the purge gas supply unit 96 that is arranged at a center with respect to the radial direction of the vacuum chamber 1 may be prevented from flowing toward the outer periphery side with respect to the radial direction of the vacuum chamber 1. In this way, controllability of the fluorine volume fraction may be improved.

As described above, according to an aspect of the substrate processing apparatus and the substrate processing method of the present embodiment, the etching amount distribution in a substrate surface may be controlled.

Although a substrate processing apparatus and a substrate processing method according to the present invention have been described above with respect to certain illustrative embodiments, the present invention is not limited to the above embodiments, and various variations and modifications may be made within the scope of the present invention.

For example, in the above descriptions, an embodiment in which the plasma generation unit 91 of the activated gas supply unit 90 is arranged above the shower head unit 93 via the pipe 94 is illustrated. However, the position of the plasma generation unit 91 is not particularly limited as long as it is arranged at a suitable position such that a fluorine-containing gas may be activated and supplied to a film that is formed on a wafer W. For example, the plasma generation unit 91 may be arranged inside the shower head unit 93 or below the shower head 93.

What is claimed is:

1. A substrate processing method comprising:
    an etching step of mounting a substrate on a surface of a rotatory table arranged in a vacuum chamber and supplying an etching gas into the vacuum chamber while rotating the rotary table to etch a film formed on a surface of the substrate;
    wherein the etching step includes
        supplying the etching gas to the surface of the rotary table and supplying a purge gas from a plurality of purge gas supply units that are provided near a region where the etching gas is supplied; and
        controlling an etching amount of etching the film by independently varying a flow rate of the purge gas that is supplied from each of the plurality of purge gas supply units.

2. The substrate processing method according to claim 1, wherein
    a flow rate of the purge gas supplied from each of the plurality of purge gas supply units is varied based on a distribution of the etching gas supplied to the surface of the rotary table.

3. The substrate processing method according to claim 2, wherein
    the flow rate of the purge gas is decreased to increase the etching amount, and the flow rate of the purge gas increased to decrease the etching amount.

4. The substrate processing method according to claim 1, further comprising
    a film forming step of supplying a first reaction gas and a second reaction gas, reacts with the first reaction gas, into the vacuum chamber while rotating the rotary table to form the film on the surface of the substrate.

5. The substrate processing method according to claim 4, wherein
    the film forming step includes a step of supplying the first reaction gas and the second reaction gas into the vacuum chamber without supplying the etching gas into the vacuum chamber while consecutively rotating the rotary table a plurality of times; and
    the etching step includes a step of supplying the etching gas and the purge gas into the vacuum chamber without supplying the first reaction gas and the second reaction gas into the vacuum chamber while consecutively rotating the rotary table a plurality of times.

6. The substrate processing method according to claim 4, wherein
    the first reaction gas, the second reaction gas, the etching gas, and the purge gas are simultaneously supplied into the vacuum chamber while consecutively rotating the rotary table a plurality of times; and
    the film forming step and the etching step are each performed once during one rotation cycle of the rotary table, and the rotation cycle is repeated a plurality of times.

* * * * *